United States Patent [19]
Nakatsuka et al.

[11] Patent Number: 5,524,013

[45] Date of Patent: Jun. 4, 1996

[54] BEAM SCANNABLE LASER DIODE

[75] Inventors: Shin'ichi Nakatsuka, Hino; Susumu Saito, Hachioji, both of Japan

[73] Assignees: Hitachi, Ltd.; Hitachi Koki Co., Ltd., both of Tokyo, Japan

[21] Appl. No.: 286,351

[22] Filed: Aug. 4, 1994

[30]    Foreign Application Priority Data

Aug. 20, 1993   [JP]   Japan ................................. 5-206544

[51] Int. Cl.⁶ ................................ H01S 3/10; H01S 3/19
[52] U.S. Cl. ................................ 372/24; 372/45; 372/46; 372/50
[58] Field of Search ................................ 372/46, 45, 50, 372/24, 108

[56]    References Cited

U.S. PATENT DOCUMENTS 5,214,664   5/1993   Paoli ......................................... 372/50

OTHER PUBLICATIONS

Extended Abstracts of the 1991 International Conference on Solid State Devices and Materials, Yokohama, 1991, pp. 338–340; N. Ogasawara et al.: *Beam Deflection and Mode Switching Characteristics in Coupled Twin–Stripe Lasers* (no month).

*Primary Examiner*—James W. Davie
*Attorney, Agent, or Firm*—Kenyon & Kenyon

[57]   ABSTRACT

A laser diode capable of having the position and emitting direction of its laser beam readily varied as desired through control over injected currents. The laser diode has an independent current injecting region in a waveguide (intermediate region) near the mirror facet of the laser diode, the center axis of the current injecting region differing from that of another waveguide (straight region). Suitably modulating the currents injected into the current injecting region generates a desired refractive index profile, whereby beam scan is obtained as desired.

12 Claims, 4 Drawing Sheets

FIG. 4A
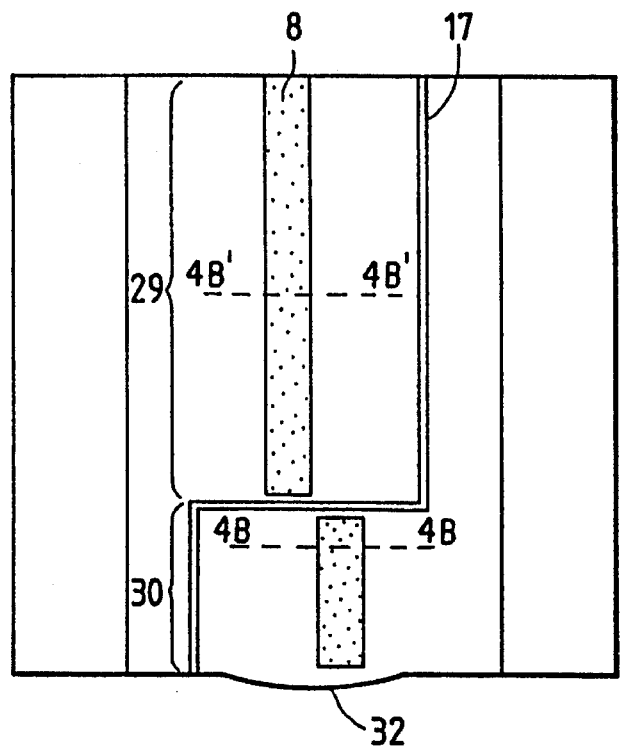
FIG. 4B
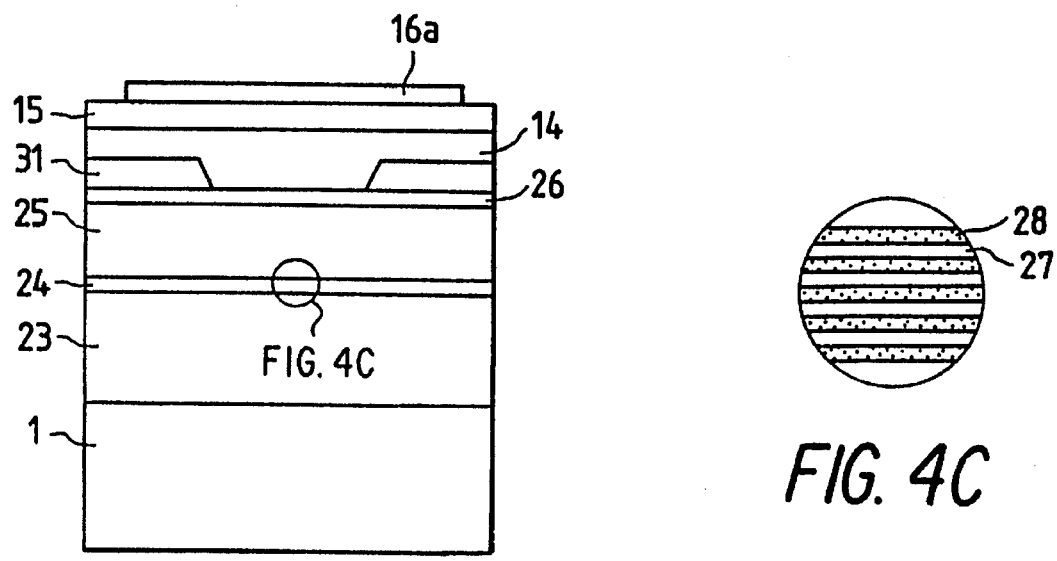
FIG. 4C

BEAM SCANNABLE LASER DIODE

BACKGROUND OF THE INVENTION

The present invention relates to a laser diode and, more particularly, to a beam scannable laser diode for use as a light source of laser beam printers, optical disks and the like.

FIG. 6 is a cross-sectional view showing a typical structure of a conventional beam scannable laser diode. The prior art of the beam scannable laser diode will now be described with reference to FIG. 6.

An n-$Al_{0.5}Ga_{0.5}As$ cladding layer 2, an AlGaAs multi-quantum-well active layer 33, a p-$Al_{0.5}Ga_{0.5}As$ cladding layer 4, and a p-GaAs contact layer 5 are deposited consecutively on an n-GaAs substrate 1. Two striped current injecting regions are exposed at the top of the layered structure so that an $SiO_2$ mask pattern 8 is formed thereon. Further on top of the layered structure are formed Au electrodes 16a and 16b arranged in parallel and spaced a predetermined distance apart. A common electrode 16c is formed at the bottom of the diode. The electrodes 16a and 16b constitute two coupled waveguides arranged in parallel. The light is confined to the active region 33 and guided by the cladding layers 2 and 4.

Injecting currents asymmetrically into the two coupled waveguides generates a mixed mode, i.e., an intermediate mode between even mode and odd mode of the light guided into the waveguides. Suitably controlling the injected currents deflects the scanning beam direction as needed.

The prior art of this field is described illustratively in the minutes of the International Conference on Solid State Device and Materials in Yokohama (1991), pp. 338–340.

The beam scan of the conventional beam scannable laser diode is accomplished by combining the above-mentioned two modes, even and odd modes. Given that characteristic, the conventional beam scannable laser diode must rely on a complicated optical system when applied to a device required to provide a single spot. The beam scan of the conventional laser diode is effected with a beam that is not collimated. Thus when an ordinary lens-based system comprising the laser diode is used to focus the beam, there occurs the problem of the focusing point staying unchanged while the beam is being deflected.

SUMMARY OF THE INVENTION

It is therefore an object of the present invention to overcome the above and other deficiencies and disadvantages of the prior art and to provide a structurally innovative beam scannable laser diode.

In carrying out the invention and according to one aspect thereof, there is provided a beam scannable laser diode structured to permit control on injecting currents into a laser-striped region independently of another laser-striped region. The distribution of injected currents into one region is made asymmetric relative to the center of the waveguide of the other region. The invention further contemplates furnishing optical means for providing lens effects on or close to the mirror facet of the laser diode so that a collimated beam scan is obtained.

In operation, the inventive laser diode has currents injected into a current modulation region asymmetrically with respect to the center of the waveguide of the other region. Injecting currents in the above manner generates a refractive index profile which bends the laser beam. The bending effect is varied by altering the amount of injected currents. It follows that the degree of beam bending is controlled by varying the amount of injected currents. This in turn allows the position of the beam emitted from the mirror facet to be varied.

Furthermore, the invention allows the region other than the current modulation region to oscillate in fundamental lateral mode, thereby easily affording a single lobed beam at focusing point. When the beam of the inventive laser diode is collimated, the beam scan and the focusing point are varied in accordance with the movement of the light-emitting position. When a lens construction is furnished on or close to the mirror facet of the laser diode, the amount of beam scan affected by the change in beam position may be magnified.

According to the present invention, other than beam scan, such application is enabled that a position of a spot on the focusing surface is changed.

Other objects, features and advantages of the present invention will become apparent in the following specification and accompanying drawings.

BRIEF DESCRIPTION OF THE DRAWINGS

FIG. 4A is a schematic plan view of a beam scannable laser diode which is in a manufacturing process and which is practiced as a third embodiment of the invention.

FIG. 4B is a cross-sectional view taken on line 4B—4B of FIG. 4A and shows schematically one aspect of the structure of the third embodiment having completed the final manufacturing process.

FIG. 4C is a magnified view of the encircled area of FIG. 4B;

DESCRIPTION OF THE PREFERRED EMBODIMENTS

Figure 1A:
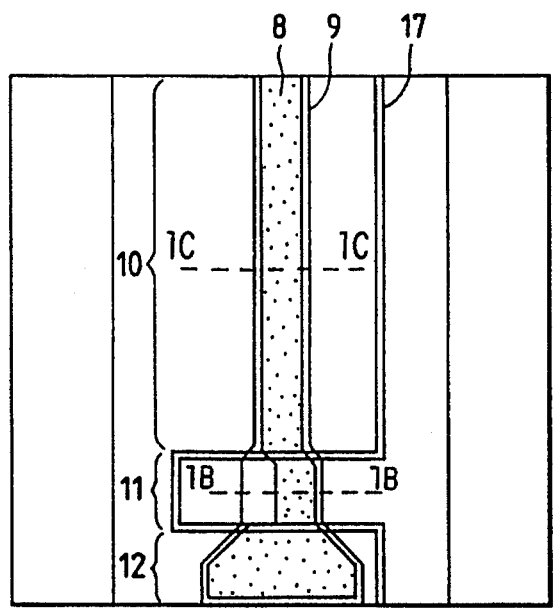
FIG. 1A is a schematic plan view of a beam scannable laser diode which is in a manufacturing process and which is practiced as a first embodiment of the invention.

The preferred embodiments of the invention will now be described with reference to the accompanying drawings.

FIRST EMBODIMENT

The first embodiment of the invention will now be described with reference to FIGS. 1A, 1B, 1C, 1D and 2.

The structure of the laser diode constituting the first embodiment is described below in conjunction with the processes for manufacturing the same. As shown in FIGS. 1B and 1C, an n-$Al_{0.5}Ga_{0.5}As$ cladding layer 2, a multi-quantum-well active layer 3, a p-$Al_{0.5}Ga_{0.5}As$ cladding layer 4, and a p-GaAs contact layer 5 are grown consecutively in crystals on an n-GaAs wafer substrate 1. As indicated in the magnified view of the encircled area of FIG. 1C shown in FIG. 1D, the multi-quantum-well active layer 3 is composed of four $Al_{0.1}Ga_{0.9}As$ well layers 6 and five $Al_{0.3}Ga_{0.7}As$ barrier layers 7, deposited one upon another alternately.

Figure 1C:
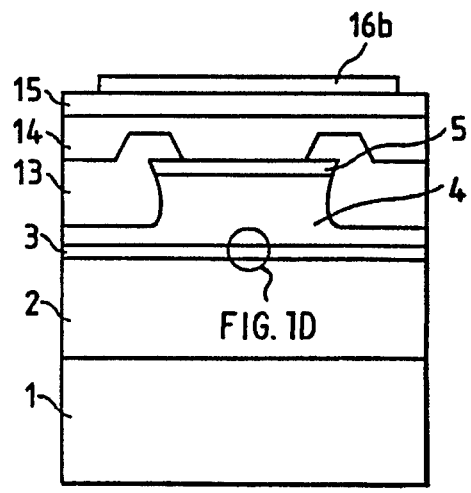
FIG. 1C is a cross-sectional view taken on line 1C—1C of FIG. 1A and depicts schematically another aspect of the structure of the first embodiment having completed the final manufacturing process.
Figure 1B:
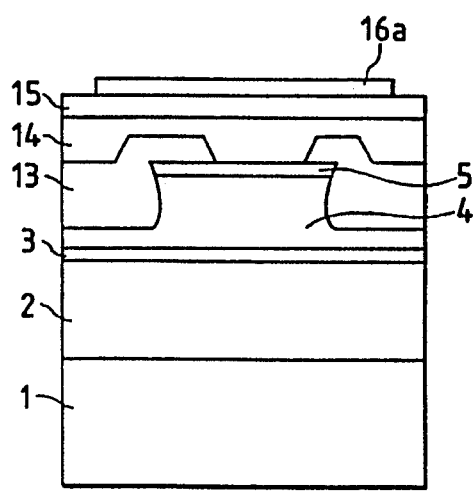
FIG. 1B is a cross-sectional view taken on line 1B—1B of FIG. 1A and shows schematically one aspect of the structure of the first embodiment having completed the final manufacturing process.
Figure 1D:
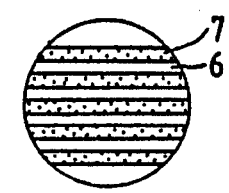
FIG. 1D is a magnified view of the encircled area of FIG. 1C.

Referring to FIG. 1A, a striped $SiO_2$ mask 8 and a photo-resist mask 9 are deposited consecutively on the p-GaAs contact layer 5 by resorting to chemical vapor deposition and photolithography. The photo-resist mask 9 comprises three portions: a straight region 10 about 5 μm wide and 520 μm long; an intermediate region 11, 50 μm long; and a flare region 12, 30 μm long and flared from 10 to 20 μm toward the mirror facet. The $SiO_2$ mask 8 is 5 μm wide and formed straight in the straight region 10 and in the intermediate region 11. In the flare region 12, the $SiO_2$ mask 8 is flared from 5 to 20 μm toward the mirror facet. In the intermediate region 11, the center of the $SiO_2$ mask 8 is dislodged about 3 μm to the right from the center of the photo-resist mask 9.

With the photo-resist mask 9 now used as the effective mask, the p-GaAs contact layer 5 and p-$Al_{0.5}Ga_{0.5}As$ cladding layer 4 are partially removed by etching. After the etching, the photo-resist mask 9 is removed so as to expose the $SiO_2$ mask 8. In the region where the $SiO_2$ mask 8 is not formed, an n-$In_{0.5}Ga_{0.5}P$ blocking layer 13 is selectively grown in crystals by use of known metal-organic chemical vapor deposition procedures.

The $SiO_2$ mask 8 is then removed to lower the series resistance of the diode. Thereafter, a P-$Al_{0.5}Ga_{0.5}As$ buried layer 14 and a p-GaAs cap layer 15 are consecutively grown in crystals by the same metal-organic chemical vapor deposition as is used to form the blocking layer 13.

On the front surface and the back of the wafer, Au electrodes 16 are formed (the electrode on the back not shown in FIGS. 1B and 1C). A separation channel 17 (about 2 to 5 μm wide) is formed as illustrated in FIG. 1A over the front surface electrode 16, p-$Al_{0.5}Ga_{0.5}As$ buried layer 14 and p-GaAs cap layer 15. The wafer of the above structure is then cleaved to an approximate length of 600 μm, whereby laser chips are produced.

Forming the separation channel 17 to the depth of three layers, i.e., the front surface electrode 16, cap layer 15 and buried layer 14, divides the front surface electrode 16 into two portions 16a and 16b. This substantially provides a laser diode made up of two regions whose cross-sectional structures are shown in FIG. 1B (taken on line 1B—1B of FIG. 1A) and FIG. 1C (taken on line 1C—1C). The desired performance is acquired by suitably injecting different currents into the two independent front surface electrodes 16a and 16b.

The intermediate region 11 (the device region whose cross-sectional view is taken on line 1B—1B) is fed with the current from the front surface electrode 16a. Varying the current to the region 11 causes the refractive index profile of that region to become asymmetrical relative to the waveguide formed by etching through the photo-resist mask 9. This allows the beam to bend in accordance with the amount of injected currents.

Figure 2:
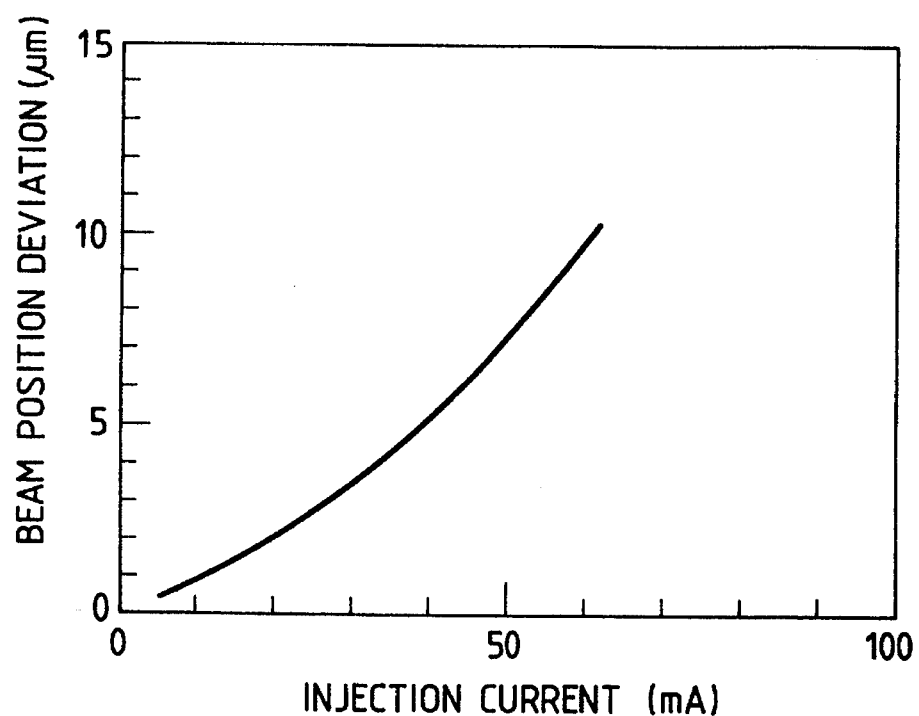
FIG. 2 is a graphic representation plotting the relationship between the amount of injected currents into the facet region of the first embodiment and beam position deviations.

FIG. 2 graphically shows the relationship between beam position deviations and injected current density regarding the first embodiment. As illustrated, varying the amount of currents injected to one region of the diode makes it possible easily to change the beam position deviation. This provides the novel beam scannable laser diode embodying the invention.

When the inventive laser diode is used illustratively in an optical disk apparatus, it is easy to control the beam position on the disk surface by use of electrical signals. The ease of beam position control is such that a plurality of tracks may be accessed per disk revolution. This boosts the operating speed of the apparatus to twice to three times that of the comparable conventional apparatus.

SECOND EMBODIMENT

Figure 3:
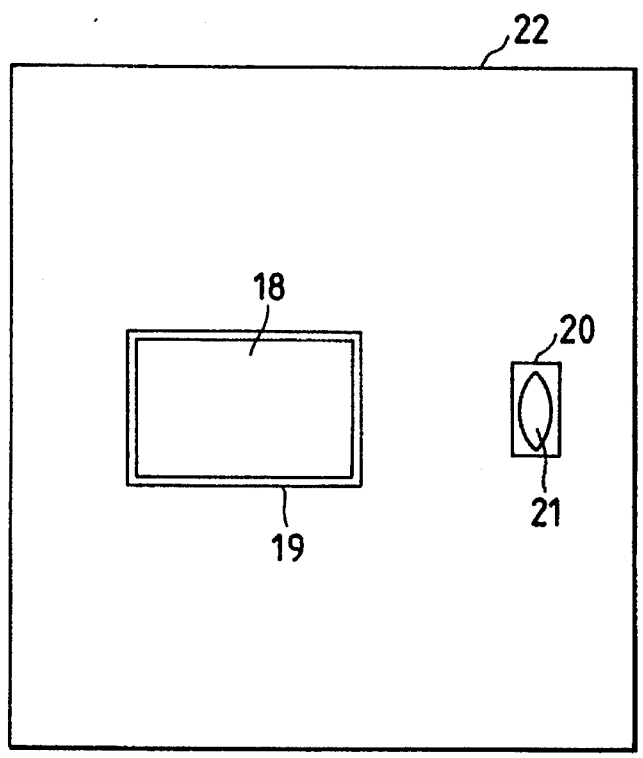
FIG. 3 is a schematic plan view of an optical package incorporating the first embodiment to constitute a second embodiment of the invention.

FIG. 3 is a schematic plan view of a laser package constituting the second embodiment of the invention. This laser package is applied in a laser beam printer. The package comprises a beam scannable laser diode chip 18 which, obtained as the first embodiment, is assembled together with a micro lens 21 in an Si wafer package 22.

The Si wafer package 22 is used as an assembling board on which a hollow 19 and a hole 20 are formed. The hollow 19 conforms to the shape of the laser chip 18 as illustrated, and the hole 20 is used to secure the micro lens 21 in place. On the assembling board, the relevant parts are fixedly assembled so that the focusing point of the micro lens 21 is positioned on the mirror facet of the laser chip 18. The micro lens 21 is about 50 μm in diameter and has a focal distance of about 100 μm.

The beam emitted by the laser diode 18 is turned into a collimated beam by the micro lens 21. In this case, as shown in FIG. 2, the beam position of the laser beam is changed by about 10 μm by modulating the current to the facet region of the laser diode 18 (i.e., the device region whose cross-sectional view is taken on line 1B—1B in FIG. 1A). This in turn cause the scanning beam direction to change by about 10 degrees.

The laser beam, now collimated, may be focused by a spherical lens onto any desired position over the drum surface of the laser beam printer. This feature eliminates the need for beam scan effected by the polygon mirror, i.e., the mechanical mirror rotating mechanism indispensable in conventional laser beam printers. With the inventive laser diode package incorporated, the laser beam printer can be reduced drastically in size, made much less expensive, and boosted appreciably in operating speed.

THIRD EMBODIMENT

The third embodiment of the invention will now be described with reference to FIGS. 4A, 4B, 4C and 5. FIG. 4A is a schematic plan view of the third embodiment being in a manufacturing process. FIG. 4B is a schematic cross-sectional view of the third embodiment having completed the final manufacturing process. More specifically, FIG. 4B is a cross-sectional view taken on line 4B—4B of FIG. 4A. The cross-sectional view taken on line 4B'—4B' of FIG. 4A is substantially the same as that taken on line 4B—4B, except that the center axis of the stripe in the former view is a little dislodged from that in the latter view as illustrated. Because FIG. 4B illustrates two aspects of the diode structure using much the same cross-sectional view, the view taken on line 4B'—4B' is omitted. The structure of the laser diode constituting the third embodiment is described below in conjunction with the processes for manufacturing the same.

As shown in FIG. 4B, an n-$(Al_{0.7}Ga_{0.3})_{0.5}In_{0.5}P$ cladding layer 23, a multi-quantum-well active layer 24, a P-$(Al_{0.7}Ga_{0.3})_{0.5}In_{0.5}P$ cladding layer 25, and a p-$Ga_{0.5}In_{0.5}P$ contact layer 26 are grown consecutively in crystals on the n-GaAs wafer substrate 1. As indicated in the magnified view of the encircled area of FIG. 4B shown in FIG. 4C, the multi-quantum-well active layer 24 is composed of four $Ga_{0.5}In_{0.5}P$ well layers 27 and five $(Al_{0.5}Ga_{0.5})_{0.5}In_{0.5}P$ barrier layers 28, deposited one upon another alternately.

Referring to FIG. 4A, a striped $SiO_2$ mask 8 is deposited by resorting to known chemical vapor deposition and photolithography procedures. The $SiO_2$ mask 8 is of a straight structure 5 μm wide. The center of the $SiO_2$ mask 8 in a laser diode center region 29 is dislodged about 5 μm from that in a near-edge region 30.

Referring now to FIG. 4B, in the region where the $SiO_2$ mask 8 is not formed, an n-GaAs blocking layer 31 is selectively grown by resorting to known metal-organic chemical vapor deposition procedures. With the $SiO_2$ mask 8 removed to lower the series resistance of the diode, a p-$Al_{0.5}Ga_{0.5}As$ buried layer 14 and a p-GaAs cap layer 15 are consecutively grown in crystals by the same metal-organic chemical vapor deposition as is used to form the n-GaAs blocking layer 31.

Referring to FIG. 4B, on the front surface and the back of the wafer are formed Au electrodes 16 (the electrode on the back not shown). A separation channel 17 is formed as illustrated in FIG. 4A over the front surface electrode 16, p-$Al_{0.5}Ga_{0.5}As$ buried layer 14 and p-GaAs cap layer 15. The wafer of the above structure is then etched by reactive ion beam etching (RIBE) to form a cavity about 600 μm long. In this case, the mirror facet of the laser diode is machined into a parabolic surface 32 depicted in FIG. 4A.

The separation channel 17 divides the current-injecting electrode 16 into the laser diode center region 29 and near-edge region 30. The mirror facet of the laser diode so structured emits a substantially collimated beam at the angle varying with the amount of injected currents.

Figure 5:
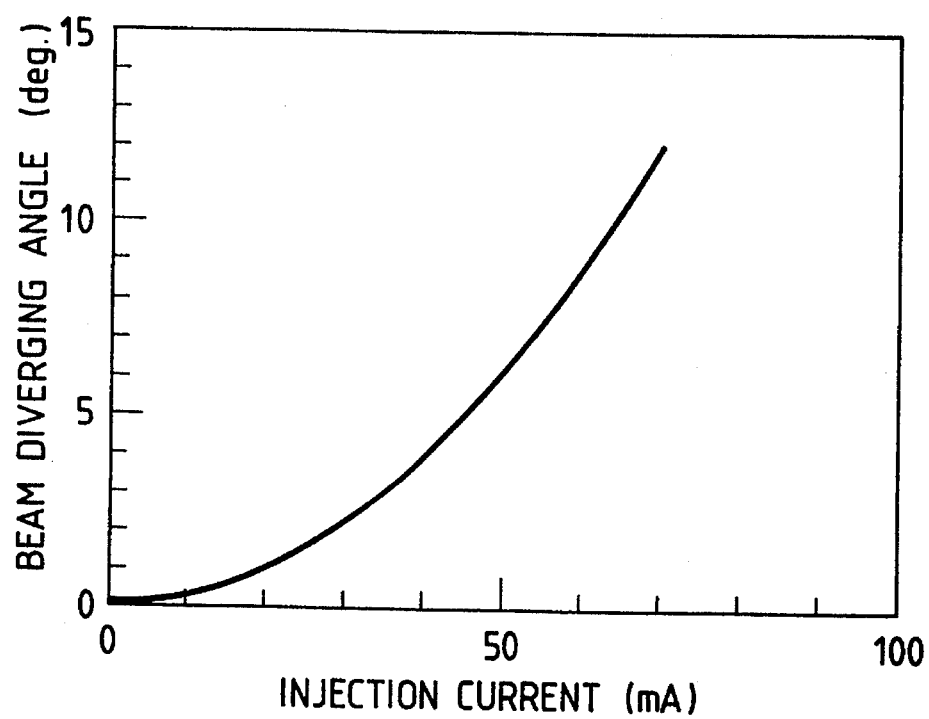
FIG. 5 is a graphic representation plotting the relationship between the amount of injected currents into the near-edge region of the third embodiment on the one hand, and beam diverging angles on the other.
Figure 6:
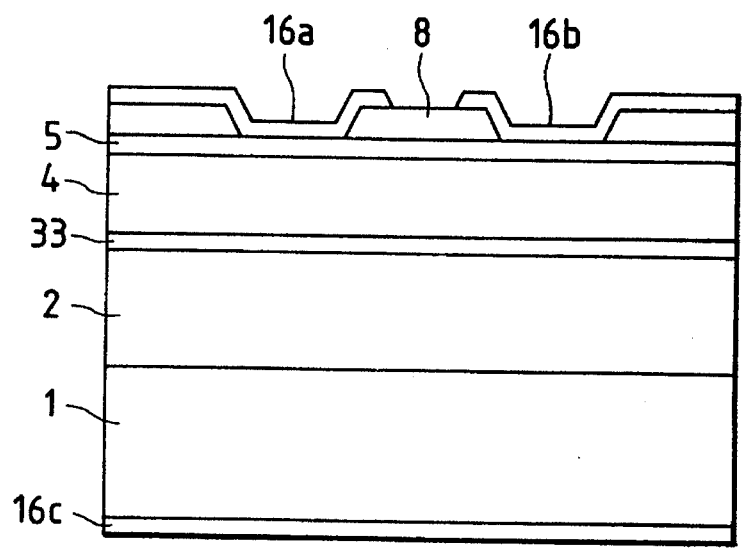
FIG. 6 is a cross-sectional view showing a typical structure of the conventional beam scannable laser diode.

FIG. 5 graphically plots the relationship between the amount of injected currents into the near-edge region 30 of the third embodiment on the one hand, and beam diverging angles on the other. As illustrated, the beam diverging angle is varied as desired by altering the amount of injected currents.

When the third embodiment was applied experimentally in a bar code reader, the embodiment eliminated the need for the conventionally indispensable polygon mirror because beam scan was accomplished electrically. Thus the bar code reader was reduced drastically in size, made much less expensive, and boosted appreciably in operating speed.

As described and according to the invention, beam scan is readily achieved by suitably controlling the amount of injected currents into one of the two laser diode regions, whereby the inventive beam scannable laser diode is implemented. With beam scan provided by electrical signals, the invention eliminates the need for conventional mechanical beam scanning means included in varieties of laser-beam applied systems. This makes it possible to manufacture laser beam-based apparatuses that are appreciably smaller, much less expensive and operating at higher speeds than ever before.

While preferred embodiments of the invention have been described using specific terms, such description is for illustrative purposes only, and it is to be understood that changes and variations may be made without departing from the spirit or scope of the following claims.

What is claimed is:

1. A beam scannable laser diode comprising:
   a striped structure having a function for generating optical gain when powered and a function for guiding light, wherein said striped structure has a pair of front surface electrodes which are electrically divided by a separation channel respectively;
   a reflector for reflecting light toward said striped structure; and
   a means for providing control on injecting currents into a first region which is part of said striped structure, in a manner independent of a second region adjacent to said first region;
   wherein at least part of said first region has a refractive index profile that is asymmetrical with respect to the center axis of a waveguide included in said second region.

2. A beam scannable laser diode according to claim 1, further comprising optical means for providing lens effects either on or close to the mirror facet of the laser diode.

3. A beam scannable laser diode according to claim 1, wherein said striped structure is divided by a separation channel into a straight region, an intermediate region and a flare region, the three regions acting as mutually independent regions into which to inject currents.

4. A beam scannable laser diode according to claim 1, wherein said striped structure is divided by a separation channel into a straight center region and a near-edge region, the two regions acting as mutually independent regions into which to inject currents.

5. A beam scannable laser diode according to claim 2, wherein said striped structure is divided by a separation channel into a straight region, an intermediate region and a flare region, the three regions acting as mutually independent regions into which to inject currents.

6. A beam scannable laser diode according to claim 2, wherein said striped structure is divided by a separation channel into a straight center region and a near-edge region, the two regions acting as mutually independent regions into which to inject currents.

7. A laser diode package comprising:
   a beam scannable laser diode, wherein said beam scannable laser diode comprises:
      a striped structure having a function for generating optical gain when powered and a function for guiding light, wherein said striped structure has a pair of front surface electrodes which are electrically divided by a separation channel respectively;
      a reflector for reflecting light toward said striped structure; and
      a means for providing control on injecting currents into a first region which is part of said striped structure, in a manner independent of a second region adjacent to said first region;
      wherein at least part of said first region has a refractive index profile that is asymmetrical with respect to the center axis of a waveguide included in said second region;
   an assembling board, wherein said beam scannable laser diode is buried in said assembling board; and
   a micro lens buried in said assembling board, wherein the focusing point of said micro lens is positioned on the mirror facet of said beam scannable laser diode.

8. A laser diode package according to claim 7, wherein said beam scannable laser diode further comprises an optical means for providing lens effects either on or close to the mirror facet of the beam scannable laser diode.

9. A laser diode package according to claim 7, wherein said striped structure of said beam scannable laser diode is divided by a separation channel into a straight region, an intermediate region and a flare region, the three regions acting as mutually independent regions into which to inject currents.

10. A laser diode package according to claim 7, wherein said striped structure of said beam scannable laser diode is divided by a separation channel into a straight center region and a near-edge region, the two regions acting as mutually independent regions into which to inject currents.

11. A laser diode package according to claim 7, wherein:

said beam scannable laser diode further comprises an optical means for providing lens effects either on or close to the mirror facet of the beam scannable laser diode; and said striped structure of said beam scannable laser diode is divided by a separation channel into a straight region, an intermediate region and a flare region, the three regions acting as mutually independent regions into which to inject currents.

12. A laser diode package according to claim 7, wherein:

said beam scannable laser diode further comprises an optical means for providing lens effects either on or close to the mirror facet of the beam scannable laser diode; and said striped structure of said beam scannable laser diode is divided by a separation channel into a straight center region and a near-edge region, the two regions acting as mutually independent regions into which to inject currents.

* * * * *